United States Patent

Gardner et al.

[11] Patent Number: 5,888,870
[45] Date of Patent: Mar. 30, 1999

[54] MEMORY CELL FABRICATION EMPLOYING AN INTERPOLY GATE DIELECTRIC ARRANGED UPON A POLISHED FLOATING GATE

[75] Inventors: Mark I. Gardner, Cedar Creek; Mark C. Gilmer, Austin, both of Tex.

[73] Assignee: Advanced Micro Devices, Inc.

[21] Appl. No.: 955,794

[22] Filed: Oct. 22, 1997

[51] Int. Cl.$^6$ .................................................. H01L 21/336
[52] U.S. Cl. ............................................ 438/261; 438/263
[58] Field of Search ..................................... 438/253, 257, 438/261, 263, 264, 305, 306, 406, 517, 592, 593, 766, 954, 240, 260, 519, 520, 527, 528, 692

[56] References Cited

U.S. PATENT DOCUMENTS

| | | | |
|---|---|---|---|
| 4,774,197 | 9/1988 | Haddad et al. | 438/954 |
| 4,789,883 | 12/1988 | Cox et al. | 438/517 |
| 5,437,762 | 8/1995 | Ochiai et al. | 438/406 |
| 5,445,984 | 8/1995 | Hong et al. | 438/261 |
| 5,654,219 | 8/1997 | Huber | 438/593 |
| 5,696,015 | 12/1997 | Hwang | 438/253 |
| 5,739,566 | 4/1998 | Ota | 257/315 |
| 5,759,894 | 6/1998 | Tseng et al. | 438/766 |

*Primary Examiner*—Charles Bowers
*Assistant Examiner*—Jack Chen
*Attorney, Agent, or Firm*—Kevin L. Daffer; Conley, Rose & Tayon

[57] ABSTRACT

A method is provided for forming a non-volatile memory cell in which the upper surface of the floating gate is polished to reduce surface irregularities, providing for the formation of a gate dielectric having a relatively high breakdown voltage thereon. According to an embodiment, a first gate dielectric is thermally grown upon a semiconductor substrate which later serves as the tunnel dielectric in the ensuing memory cell. A floating gate polysilicon is deposited across the first gate dielectric, followed by ion implantation of dopants and nitrogen therein. The upper surface of the floating gate polysilicon is then polished using, e.g., CMP. A second gate dielectric comprising high quality oxynitride may then be thermally grown across the polished surface of the floating gate polysilicon. Alternately, a ceramic having a relatively high dielectric constant may be formed across the floating gate polysilicon to serve as the second gate dielectric. A control gate polysilicon may be formed across the second gate dielectric. After doping the control gate polysilicon, portions of the layers formed above the substrate may be removed to define sidewall surfaces of a stacked structure. Source and drain regions which are self-aligned to the sidewall surfaces of the stacked structure may then be formed within the substrate.

10 Claims, 5 Drawing Sheets

MEMORY CELL FABRICATION EMPLOYING AN INTERPOLY GATE DIELECTRIC ARRANGED UPON A POLISHED FLOATING GATE

BACKGROUND OF THE INVENTION

1. Field of the Invention

This invention relates to integrated circuit fabrication and, more particularly, to forming a non-volatile memory cell having a floating gate upper surface on which a chemical mechanical polish ("CMP") is applied to enhance device performance.

2. Description of the Relevant Art

There are many types of non-volatile memory known as read only memory (ROM) or programmable read only memory (PROM). Non-volatile memory can be formed in either bipolar or MOS technology. There are various types of MOS PROMs, including, e.g., erasable programmable ROM (EPROM), electrically erasable programmable ROM (EEPROM), and flash memory EPROM (FLASH EPROM).

Non-volatile MOS PROMs can be fabricated using many well-known technologies such as: (i) floating gate tunnel oxide (FLOTOX), (ii) textured polysilicon, (iii) metal nitride oxide silicon (MNOS), and (iv) EPROM-tunnel oxide (ETOX). Program and erase of the corresponding EPROM cell differs depending upon which technology is used. For example, a floating gate tunnel oxide EPROM transistor is programmed (moving electrons into the floating gate) by biasing the control gate, while erasure (moving electrons out of the floating gate) is achieved by biasing the drain. Programming a textured poly-type EPROM device involves electrons tunneling from a first polysilicon to a second polysilicon, wherein erase involves electrons tunneling from the second polysilicon to a third polysilicon. In MNOS-type devices, the charge is stored in discrete traps in the bulk of the nitride. It is generally recognized that stacked polysilicon conductors are used to perform the program and erase function for each form of EPROM.

FIG. 1 illustrates a FLOTOX EEPROM memory cell according to conventional design. The FLOXTOX cell includes a relatively thin tunnel oxide 12 interposed between a doped polysilicon floating gate 14 and a semiconductor topography 10. Tunnel oxide 12 is typically thermally grown upon topography 10 to a thickness of less than e.g., 100 Å. The FLOXTOX cell further includes an interpoly dielectric 16 arranged upon floating gate 14 and underlying a doped polysilicon control gate 18. Fabrication of the FLOXTOX cell may involve forming these layers upon each other above semiconductor substrate 10 and then etching away portions of the layers not masked by a patterned photoresist layer to form the stacked structure shown in FIG. 1. A heavily concentrated dopant distribution which is self-aligned to the opposed sidewalls of the stacked structure may then be forwarded into substrate 10 to form source and drain regions 20 and 22, respectively. A thermally grown oxide layer 24 may be thermally grown upon the periphery of the stacked structure and upon exposed regions of substrate 10. Due to thermal exposure during this process, the impurities within source and drain regions 20 and 22 undergo lateral migration toward the channel region underneath tunnel oxide 12, resulting in the configuration depicted in FIG. 1.

Control gate 18 can be coupled to a word line, and bit line conductors can be formed within contact windows of a dielectric for making contact to drain region 22 (not shown). Charging of floating gate 14 to program the cell can be achieved by grounding source and drain regions 20 and 22 and applying a relatively high voltage to control gate 18. In the programming state, electrons pass through tunnel oxide 12 to floating gate 14 by a tunneling mechanism known as Fowler-Nordheim tunneling. As more electrons accumulate in floating gate 14, the electric field is reduced such that charge becomes stored in the floating gate. Discharge of floating gate 14 to erase the cell can be achieved by grounding control gate 18, floating gate 14, and source region 20 and applying a relatively high voltage to drain region 22.

Because of the increased desire to build faster operating integrated circuits, it has become necessary to increase capacitive coupling between the floating gate and the control gate of the memory cell while simultaneously inhibiting electrons from escaping from the floating gate to the control gate. The control gate-to-floating gate capacitance is dependent upon the thickness of the interpoly oxide arranged between the two gates and the relative permittivity of the interpoly oxide. Unfortunately, the relative permittivity, or dielectric constant, K, of the interpoly oxide limits the amount of gate-to-substrate capacitance that can be achieved when a transistor is in operation. Permittivity, $\epsilon$, of a material reflects the ability of the material to be polarized by an electric field. The capacitance between two layers of conductive material separated by a dielectric is directly proportional to the permittivity of the dielectric. The permittivity of a material is typically described as its permittivity normalized to the permittivity of a vacuum, $\epsilon_0$. Hence, the relative permittivity or dielectric constant of a material is defined as:

$$K=\epsilon/\epsilon_0$$

Since oxide (i.e., silicon dioxide) has a relatively low K of approximately 3.7 to 3.8, the amount of capacitive coupling between the control gate and the floating gate is somewhat limited.

As mentioned above, the control gate-to-floating gate capacitance is also affected by the thickness of the interpoly oxide. Conventional memory cells typically include a relatively thin interpoly oxide to reduce capacitive coupling between the two gates. Consequently, the voltage (i.e., voltage applied to the control gate) required to initiate electron flow between the drain region and the floating gate is decreased. Unfortunately, the thin interpoly oxide may break down when subjected to an electric field, permitting electrons to pass through the oxide by what is known as the quantum mechanical tunneling effect. In this manner, a tunneling current may undesirably form between the floating gate and the control gate, resulting in data not being properly retained by the memory cell.

Breakdown of the interpoly oxide is particularly a problem if it is thermally grown upon a polysilicon floating gate. Because formation of the floating gate involves deposition of amorphous polysilicon, it is believed that the collimated nature of the floating gate contains an irregular grain structure having various crystal orientations. As a result, surface asperity appears at the interface between the interpoly oxide and the underlying floating gate. It is believed that the irregularity of the polysilicon grain structure prevents strong bonding between silicon atoms of the floating gate and oxygen atoms from the ambient. Since a relatively low temperature of about 800° C. is used to form the interpoly oxide, oxygen atoms cannot easily migrate through localized barriers present in the irregular grain structure to bond with underlying silicon atoms. In other words, there are not enough opportune bond sites proximate the floating gate surface. Using high temperature thermal oxidation is not a viable option because problems, such as impurities moving to undesirable locations (e.g., from the floating gate to the tunnel oxide) may occur via principles of segregation and diffusion. It is postulated that the resulting interpoly oxide is not of high quality. The interface between the interpoly oxide and the floating gate may contain migration pathways through which electrons can pass. Thus, the resulting interpoly oxide formed in the above manner may have an undesirably low breakdown across the interpoly oxide.

It would therefore be desirable to develop a technique for fabricating a memory cell having reduced control gate-to-floating gate capacitance which is substantially resistant to interpoly dielectric breakdown. Fabrication of a relatively thin interpoly oxide between the floating gate and control gate must be avoided. It would be beneficial if the floating gate and interpoly dielectric could be formed such that surface asperity is reduced at the floating gate/interpoly dielectric interface. The resulting memory cell could be transformed quickly into its programming state for immediate data storage. Further, formation of a tunneling current between the floating gate and the control gate of the memory cell would be less likely. Proper data retainage would thus be possible, resulting in a more reliable memory cell.

SUMMARY OF THE INVENTION

The problems outlined above are in large part solved by the technique hereof for fabricating a memory cell in which the upper surface of a doped polysilicon floating gate is polished prior to forming an interpoly dielectric thereon. The breakdown voltage of the interpoly dielectric is thus increased, making electron movement from the floating gate to the control gate arranged above the interpoly dielectric less likely. It is theorized that polishing the surface of the floating gate reduces the surface irregularities inherent to deposited polysilicon and thus increases the net surface area of the structure. As a result, more opportune bond sites become exposed near the surface of the polysilicon floating gate, despite the irregular grain structure of amorphous polysilicon. Consequently, a high quality interpoly dielectric may be thermally grown upon and into the polysilicon floating gate.

In one embodiment, an oxynitride interpoly dielectric is thermally grown upon the polished surface of the polysilicon floating gate. Formation of the oxynitride interpoly dielectric involves exposing the polysilicon floating gate to an ambient entrained with nitrogen and oxygen containing compounds at a temperature of less than approximately 1000° C. There are a relatively large number of dangling bonds proximate the polished surface of the floating gate to which the nitrogen and oxygen atoms may bond. Thus, a high quality oxynitride is formed, and surface asperity at the interpoly dielectric/floating gate interface is not as prevalent. The breakdown voltage of the resulting oxynitride interpoly dielectric is relatively high such that electrons are inhibited from passing through it. Advantageously, the presence of nitrogen atoms within the interpoly dielectric helps reduce the growth rate of oxide (and therefore uneven growth) upon the adjacent polysilicon surfaces during subsequent annealing steps.

In an alternate embodiment, the interpoly dielectric is formed from a ceramic having a relatively high dielectric constant which is deposited across the polished surface of the floating gate. Since the floating gate surface contains few irregularities, the ceramic material meshes well with the polysilicon floating gate. Thus, migration avenues at the interface between the floating gate and the ceramic interpoly dielectric are reduced. Further, since the K value of the ceramic interpoly dielectric is greater than approximately 3.8, the control gate-to-floating gate capacitance, being directly proportional to K, is reduced. As a result, a memory cell employing the relatively high K ceramic interpoly dielectric can more quickly transition to its programming state. Moreover, the reduction of the control gate-to-floating gate capacitance can be accomplished advantageously without resorting to decreasing the interpoly dielectric thickness. In other words, a thicker interpoly dielectric can be used to achieve the same capacitive coupling between the floating gate and the control gate as compared to using an interpoly dielectric composed of oxide. Therefore, the probability that the interpoly dielectric will breakdown due to localized thinning is significantly reduced. In this manner, problems such as electrons passing from the floating gate to the control gate via the thicker ceramic-based interpoly dielectric are less likely to be encountered.

According to one embodiment of the present invention, a semiconductor substrate comprising single crystalline silicon is provided. A relatively thin first gate dielectric (or tunnel dielectric) composed of oxide or oxynitride is thermally grown upon the substrate. A floating gate polysilicon is deposited across the first gate dielectric using chemical vapor deposition ("CVD"). The floating gate polysilicon is then implanted with impurities to increase its conductivity. The floating gate polysilicon may also be incorporated with nitrogen atoms using, e.g., ion implantation of nitrogen. The presence of the nitrogen atoms within the floating gate polysilicon may fill voids and interstitial positions and "stuff" grain boundaries of the polysilicon. As a result, the nitrogen atoms may prevent foreign atoms from passing into and becoming positioned within the doped polysilicon. Further, the nitrogen atoms minimize migration pathways out of the floating gate polysilicon so that impurities cannot pass to other areas of the semiconductor topography.

Subsequently, a second gate dielectric (or interpoly gate dielectric) is formed upon the polished surface of the floating gate polysilicon. Formation of the second gate dielectric may be achieved by thermally growing oxynitride upon the floating gate polysilicon. Alternately, a ceramic may be sputtered from a ceramic target onto the semiconductor substrate to form the second gate dielectric. The ceramic gate dielectric preferably has a relatively high dielectric constant of greater than approximately 3.8. Examples of ceramics having a high K are, e.g., barium strontium titanate, lead lanthanum zirconate titanate, barium zirconate titanate, cerium oxide, and tin oxide. The upper surface of the ceramic gate dielectric may be polished to remove surface irregularities. A control gate polysilicon may then be deposited across the second gate dielectric, followed by ion implantation of impurities into the control gate polysilicon.

A refractory metal, e.g., cobalt or titanium is then deposited across the control gate polysilicon using either physical vapor deposition (PVD) or CVD. PVD of the refractory metal may involve sputtering the metal from a metal target. More specifically, CVD of the refractory metal may be performed using metal organic CVD ("MOCVD") in which the polysilicon is exposed to a gas containing a metal organic compound. The refractory metal is then heated by placing the semiconductor topography in a high temperature furnace or by using Rapid Thermal Processing ("RTP"). As a result, metal atoms and silicon atoms of the polysilicon layer undergo cross-diffusion at the metal/polysilicon interface and react to form metal silicide. The metal silicide has a lower resistivity compared to the doped control gate polysilicon, resulting in better conduction in the ensuing control gate.

Memory cell formation may be completed by etching portions of the metal silicide, control gate polysilicon, second gate dielectric, floating gate polysilicon, and the first gate dielectric to define opposed sidewall surfaces of the stacked structure. Source/drain regions which are self-aligned to the exposed lateral surfaces of the stacked structures are implanted into the substrate. A dielectric is thermally grown across the exposed peripheral surfaces of the stacked structure and the substrate. Impurities within the source/drain regions also migrate laterally toward a region of the substrate underneath the first gate dielectric during exposure to thermal radiation. As a result, portions of the source/drain regions are arranged underneath the stacked gate/gate dielectric structure.

BRIEF DESCRIPTION OF THE DRAWINGS

Other objects and advantages of the invention will become apparent upon reading the following detailed description and upon reference to the accompanying drawings in which.

DETAILED DESCRIPTION OF THE INVENTION

Figure 1:
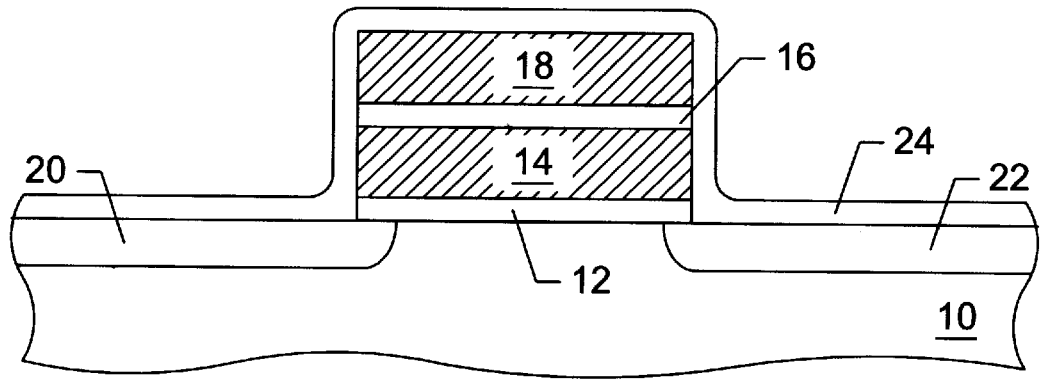
FIG. 1 is a cross-sectional view of a FLOTOX EEPROM memory cell, according to conventional design.
Figure 2:
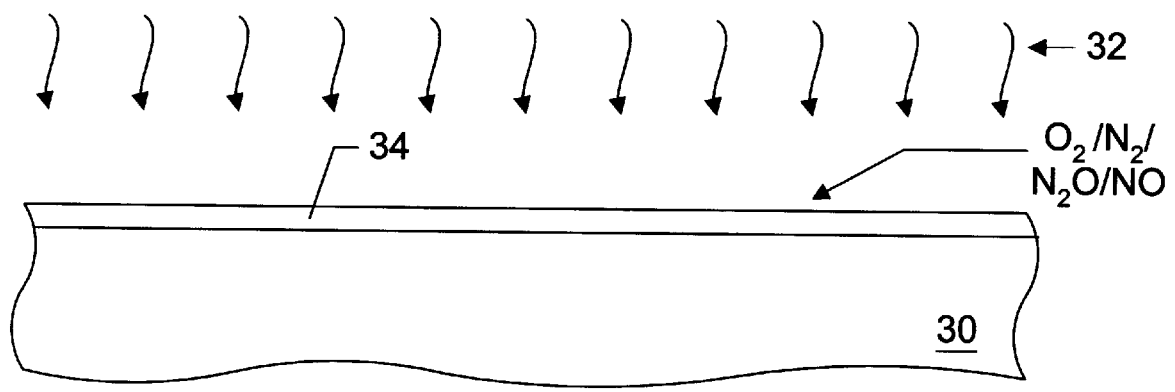
FIG. 2 is a cross-sectional view of a semiconductor topography, wherein a first gate dielectric is thermally grown upon a semiconductor substrate.

Turning now to the drawings, FIG. 2 illustrates the formation of a first gate dielectric 34 across a semiconductor substrate 30 which comprises single crystalline silicon. Although not shown in the depicted cross-section of substrate 30, dielectric isolation regions, such as trench isolation structures may be arranged spaced distances apart within the substrate for dielectrically isolating ensuing active areas. First gate dielectric 34 may be formed by exposing substrate 30 to thermal radiation 32 and to an oxygen entrained gas, thereby resulting in a thermally grown oxide. Alternately, first gate dielectric 34 may be formed by thermally growing oxynitride using a nitrogen and oxygen entrained gas. First gate dielectric 34 preferably has a thickness of less than approximately 100 Å, allowing it to function as a tunnel oxide in the ensuing EEPROM memory device.

Figure 3:
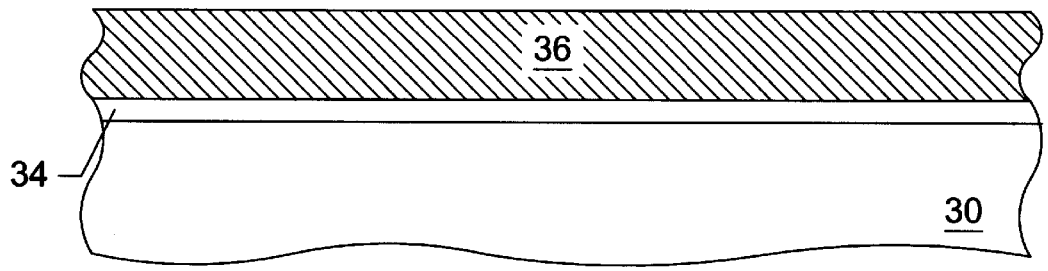
FIG. 3 is a cross-sectional view of the semiconductor topography, wherein a floating gate polysilicon is deposited across the first gate dielectric, subsequent to the step in FIG. 2.
Figure 4:
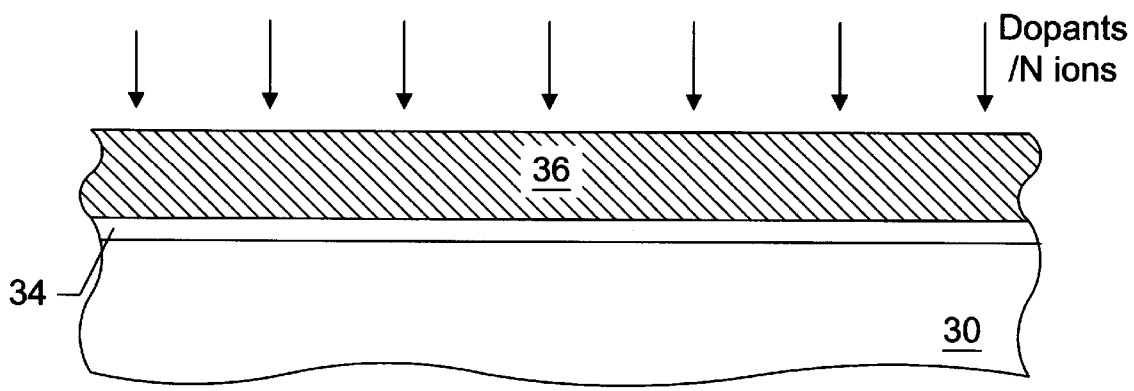
FIG. 4 is a cross-sectional view of the semiconductor topography, wherein the dopants, followed by nitrogen barrier atoms are ion implanted into the floating gate polysilicon, subsequent to the step in FIG. 3.
Figure 5:
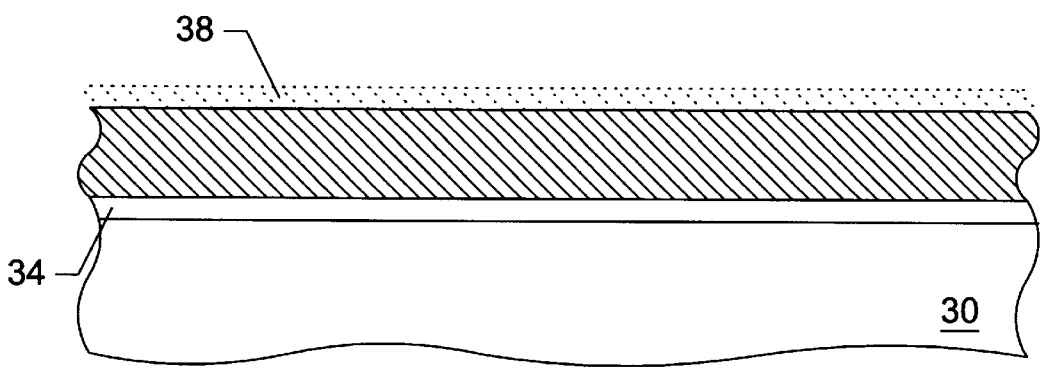
FIG. 5 is a cross-sectional view of the semiconductor topography, wherein the upper surface of the floating gate polysilicon is CMP polished, subsequent to the step in FIG. 4.

As shown in FIG. 3, a floating gate polysilicon 36 may be CVD deposited from, e.g., a silane source to a thickness of approximately 1,500 to 2,000 Å. Subsequently, ion implantation of dopants into floating gate polysilicon 36 may be performed to lower the resistivity of the polysilicon as depicted in FIG. 4. Nitrogen barrier atoms may also be implanted into the floating gate polysilicon 36. In this manner, nitrogen atoms are incorporated within floating gate polysilicon 36 such that they fill vacancy and interstitial positions therein. The nitrogen atoms may later serve to block migration avenues into and out of floating gate polysilicon 36. As a result, foreign species cannot pass into floating gate polysilicon 36 and dopants cannot pass out of the polysilicon during operation or fabrication of the ensuing memory cell. Further, the presence of nitrogen atoms occupies sites which foreign atoms and/or molecules could otherwise fill. The bonds between nitrogen and silicon atoms are believed to be sufficiently strong so as to prevent unwanted bonds of electrically deleterious contaminants. As shown in FIG. 5, the upper surface of floating gate polysilicon 36 is polished using e.g., CMP to remove surface irregularities from the amorphous polysilicon. As a result, a portion 38 of the floating gate polysilicon 36 is removed such that the thickness of the polysilicon is be reduced by approximately 50 Å.

Figure 6A:
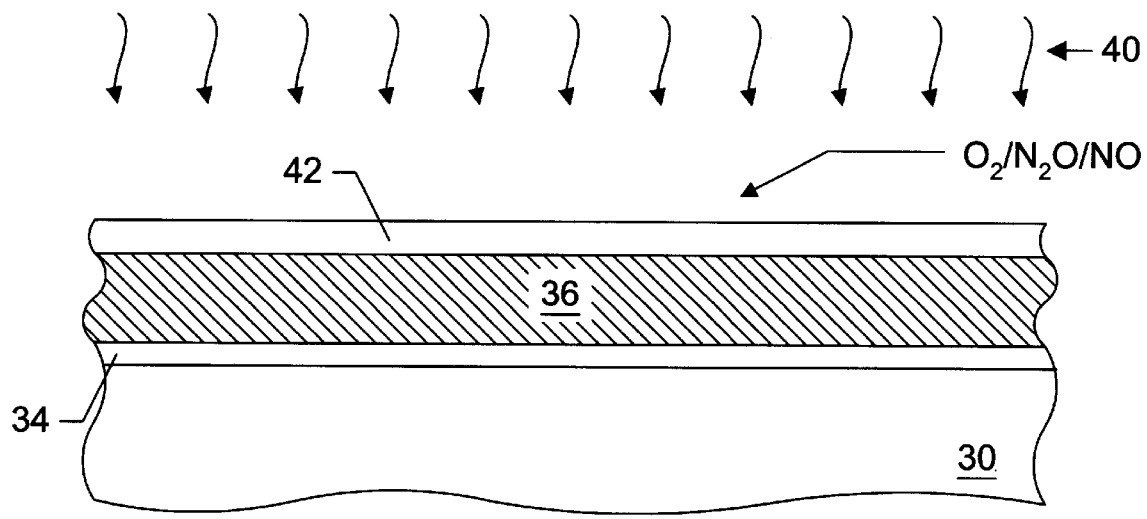
FIG. 6a is a cross-sectional view of the semiconductor topography, wherein oxynitride is thermally grown across the floating gate polysilicon to form a second gate dielectric according to one embodiment, subsequent to the step in FIG. 5.
Figure 6B:
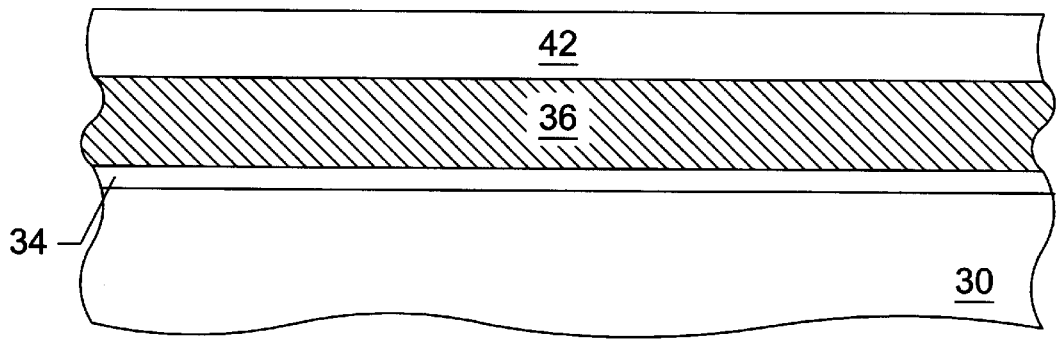
FIG. 6b is a cross-sectional view of the semiconductor topography, wherein a ceramic having a relatively high K value is deposited across the floating gate polysilicon to form a second gate dielectric according to another embodiment, subsequent to the step in FIG. 5.
Figure 7:
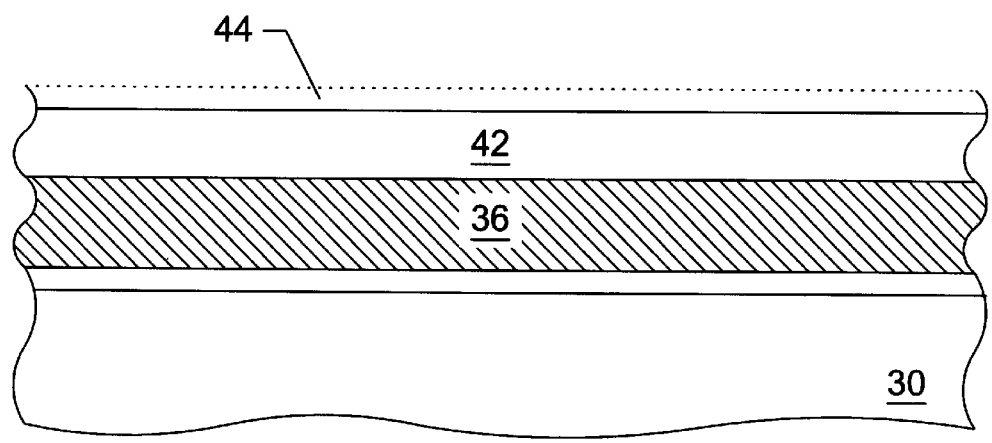
FIG. 7 is a cross-sectional view of the semiconductor topography, wherein an upper surface of the second gate dielectric is CMP polished, subsequent to the step in FIG. 6b.

As shown in FIG. 6a, the semiconductor topography may then be exposed to thermal radiation 40 while in a nitrogen and oxygen bearing ambient. Nitrogen and oxygen may be sourced from, e.g., either $N_2O$ or NO gas, or from a gas entrained with $O_2$ and $N_2$. In this manner, a second gate dielectric 42 comprising oxynitride may be thermally grown upon floating gate polysilicon 36. The thickness of the oxynitride second gate dielectric 42 is preferably less than approximately 200 Å. Alternately, as depicted in FIG. 6b, a ceramic second gate dielectric 42 having a relatively high K value may be formed across floating gate polysilicon 36 using, e.g., sputter deposition from a ceramic target. The K value of the ceramic is preferably greater than about 3.8. Suitable ceramics which have relatively high K values are, e.g., barium strontium titanate (BST), lead lanthanum zirconate titanate (PLZT), barium zirconate titanate (BZT), cerium oxide (CEO2), and tin oxide (TiO). The thickness of gate dielectric 42 may vary from about 200 Å to 1,000 Å, depending upon the dielectric constant of the ceramic as well as other properties of the ceramic. As discussed previously, the higher the dielectric constant, the higher the capacitive coupling between the ensuing control gate and the floating gate. If the second gate dielectric 42 is composed of a relatively high K dielectric, the upper surface of the dielectric is preferably CMP polished to reduce surface asperity. FIG. 7 depicts the removal of a portion 44 of second gate dielectric 42 as a result of CMP.

Figure 8:
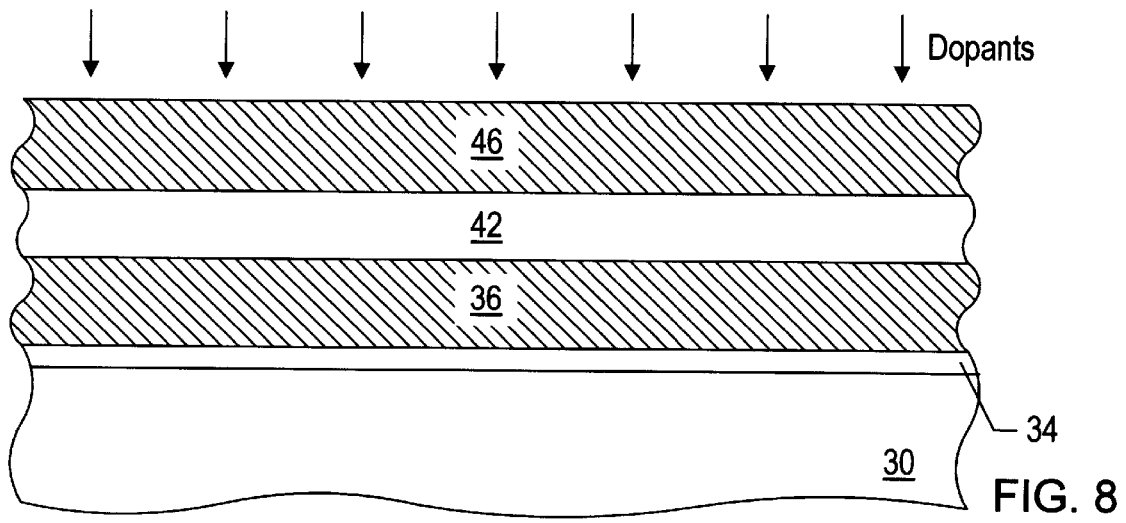
FIG. 8 is a cross-sectional view of the semiconductor topography, wherein a control gate polysilicon is deposited across the second gate dielectric and dopants are implanted into the control gate polysilicon, subsequent to the step in FIG. 7.
Figure 9:
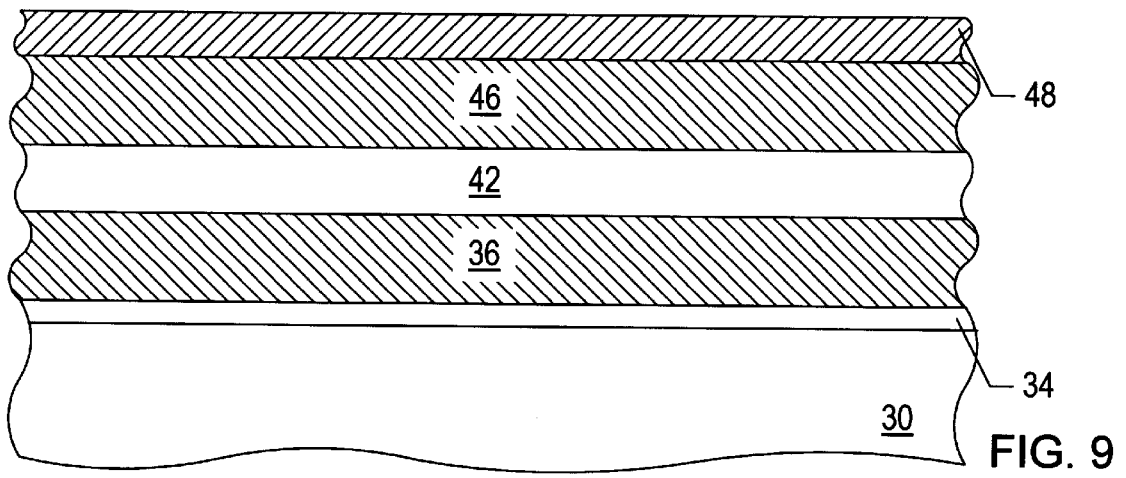
FIG. 9 is cross-sectional view of the semiconductor topography, wherein a refractory metal is deposited across the control gate polysilicon, subsequent to the step in FIG. 8.
Figure 10:
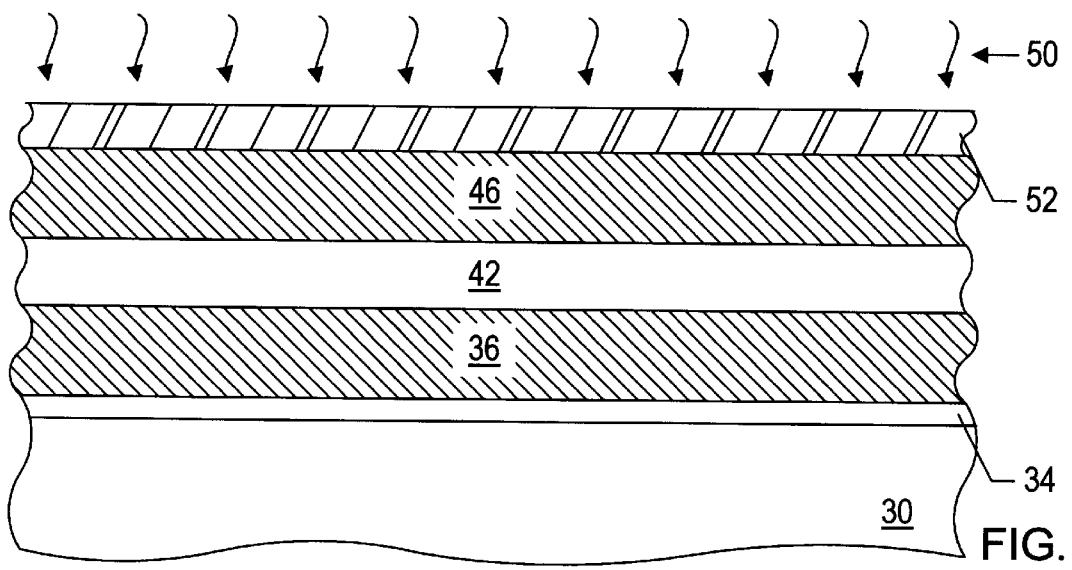
FIG. 10 is a cross-sectional view of the semiconductor topography, wherein the refractory metal is heated to form a metal silicide upon the control gate polysilicon, subsequent to the step in FIG. 9.

Turning to FIG. 8, a control gate polysilicon 46 is formed across second gate dielectric 42 using CVD of polysilicon. The control gate polysilicon 46 is preferably deposited to a thickness of approximately 500 to 1500 Å. Dopants may then be ion implanted into control gate polysilicon 46 to increase its conductivity. As illustrated in FIG. 9, a refractory metal 48, e.g., titanium or cobalt may be formed across control gate polysilicon 46. Refractory metal 48 may be sputter deposited from a metal target or MOCVD (metal organic CVD) deposited from a source comprising a volatile metal organic compound. Subsequently, refractory metal 48 may be heated to a temperature of approximately 700° C. by exposing it to a form of radiation 50, as depicted in FIG. 10. Radiation 50 may be thermal radiation provided from a heated furnace. Alternately, radiation 50 may be radiant light supplied from e.g., an arc lamp or a tungsten-halogen lamp using a technique known as rapid thermal processing ("RTP"). The use of RTP to heat refractory metal 48 may reduce the amount of contaminant diffusion into the semiconductor topography as compared to using a high temperature furnace. Raising the temperature of refractory metal 48 serves to initiate reaction between metal atoms and silicon atoms of control gate polysilicon 46 to form metal silicide 52. The metal silicide 52 is beneficial in that it has a relatively low resistivity.

Figure 11:
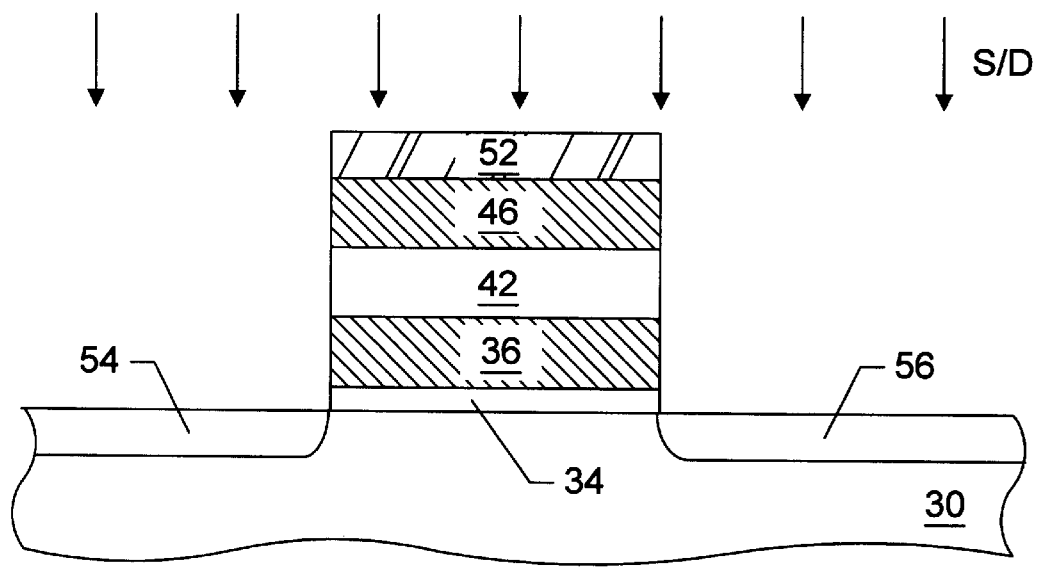
FIG. 11 is cross-sectional view of the semiconductor topography, wherein portions of the layers arranged above the substrate are removed to form a stacked structure, and a source/drain implant which is self-aligned to exposed lateral surfaces of the stacked structure is forwarded to the semiconductor topography, subsequent to the step in FIG. 10.

Turning to FIG. 11, portions of metal silicide 52 control polysilicon gate 46, second gate dielectric 42, floating polysilicon gate 36, and first gate dielectric 34, may be removed to form a stacked structure defined between a pair of opposed sidewall surfaces. Removal of those portions may involve using optical lithography and a plasma etch which is terminated before substantial portions of the surface of substrate 30 are removed. A heavy concentration source/drain implant is self-aligned to the exposed sidewall surfaces of the double gate/double gate dielectric stacked structure, thereby forming source region 54 and drain region 56 within substrate 30. The source and drain regions are preferably implanted with dopants that are opposite in type to the dopants implanted within the bulk of substrate 30.

Figure 12:
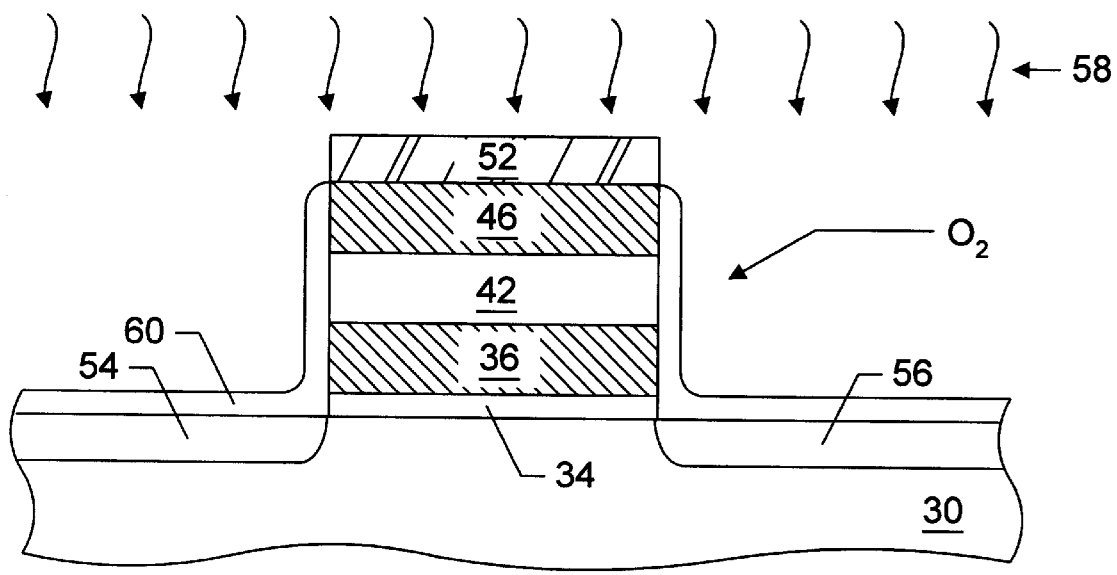
FIG. 12 is a cross-sectional view of the semiconductor topography, wherein a dielectric is thermally grown upon exposed surfaces of the stacked structure except for the surfaces of the metal silicide and upon the semiconductor substrate, subsequent to the step in FIG. 11.

FIG. 12 illustrates a dielectric layer 60 being formed across exposed regions of substrate 30 and upon exposed surfaces of floating gate 36, control gate 46, and first and second gate dielectrics 34 and 42. Although some oxide may also form upon metal silicide 52, it is an insignificant amount compared to that grown upon the other layers of the stacked structure. Whatever oxide does form upon the upper surface of metal silicide 52 may be etched away to permit the formation of a contact to the metal silicide. Dielectric layer 60 is preferably a thermally grown oxide which is formed by exposing the semiconductor topography to thermal radiation 58 and to ambient oxygen. Thermal radiation 58 also causes migration of dopants within source and drain regions 54 such that they partially extend under first gate dielectric 34. The resulting non-volatile memory cell includes a first gate dielectric 34, a floating gate 36, a second gate dielectric 42, control gate comprising polysilicon 46, and metal silicide 52. Bit line conductors may be subsequently coupled to drain region 56, and the control gate may be coupled to word lines of the ensuing integrated circuit.

It will be appreciated to those skilled in the art having the benefit of this disclosure that this invention is believed to provide a method for forming a memory cell in which the upper surface of the floating gate is polished such that a gate dielectric having a relatively high breakdown voltage may be formed thereon. Further modifications and alternative embodiments of various aspects of the invention will be apparent to those skilled in the art in view of this description. It is intended that the following claims be interpreted to embrace all such modifications and changes and, accordingly, the specification and drawings are to be regarded in an illustrative rather than a restrictive sense.

What is claimed is:

1. A method for forming a memory device, comprising:
   forming a first gate dielectric upon a semiconductor substrate;
   depositing a floating gate polysilicon across said first gate dielectric;
   implanting first impurities and nitrogen barrier atoms into said floating gate polysilicon; applying a polishing surface directly upon an upper surface of said floating gate polysilicon absent any intervening layer to form a polished surface of the floating gate polysilicon; and
   forming a second gate dielectric having a dielectric constant greater than approximately 3.8 across said polished surface of said floating gate polysilicon.

2. The method of claim 1, wherein said polishing comprises chemical-mechanical polishing.

3. The method of claim 1, wherein said first gate dielectric comprises a material selected from the group consisting of oxynitride and oxide.

4. The method of claim 1, wherein said forming the second gate dielectric comprises thermally growing an oxynitride using a nitrogen and oxygen bearing ambient.

5. The method of claim 1, wherein said forming the second gate dielectric comprises depositing a ceramic having a dielectric constant greater than approximately 3.8.

6. The method of claim 1, wherein said second gate dielectric comprises a ceramic selected from the group consisting of barium strontium titanate, lead lanthanum zirconate titanate, barium zirconate titanate, cerium oxide, and tin oxide.

7. The method of claim 6, further comprising depositing a control gate polysilicon across said second gate dielectric.

8. The method of claim 7, further comprising chemical-mechanical polishing said ceramic second gate dielectric prior to said depositing the control gate polysilicon across said second gate dielectric.

9. The method of claim 8, further comprising:
   implanting second impurities into said control gate polysilicon;
   forming a metal silicide upon said control gate polysilicon;
   removing portions of said metal silicide, said floating gate polysilicon, said second gate dielectric, and said control gate polysilicon; and
   implanting third impurities into exposed portions of said semiconductor substrate to form source and drain regions within said semiconductor substrate.

10. The method of claim 5, wherein said ceramic is deposited to a thickness of about 200 to 1,000 Å.

* * * * *